United States Patent [19]
Sahota et al.

[11] Patent Number: 5,665,199
[45] Date of Patent: Sep. 9, 1997

[54] METHODOLOGY FOR DEVELOPING PRODUCT-SPECIFIC INTERLAYER DIELECTRIC POLISH PROCESSES

[75] Inventors: Kashmir S. Sahota, Fremont; Steven C. Avanzino, Cupertino, both of Calif.

[73] Assignee: Advanced Micro Devices, Inc., Sunnyvale, Calif.

[21] Appl. No.: 493,972

[22] Filed: Jun. 23, 1995

[51] Int. Cl.$^6$ .................................................. H01L 21/306
[52] U.S. Cl. ......................... 438/14; 216/84; 364/468.28; 438/16
[58] Field of Search ......................... 216/84, 85, 88, 216/89; 156/626.1, 636.1

[56] References Cited

U.S. PATENT DOCUMENTS

| | | | |
|---|---|---|---|
| 5,234,868 | 8/1993 | Cote | 216/85 |
| 5,298,110 | 3/1994 | Schoenborn et al. | 156/626.1 |
| 5,391,258 | 2/1995 | Brancaleoni et al. | 216/89 |

OTHER PUBLICATIONS

Stell, M. et al. "Planarization ability of chemical mechanical planarization (CMP) processes" Advanced Metallization for Devices and Circuits–Science, Technology and Manufacturability Symposium, MRS proceedings, vol. 337, pp. 151–156. Apr. 1994.

Landis, H. et al. "Integration of chemical–mechanical polishing into CMOS integrated circuit manufacturing" Thin Solid Films, vol. 220 pp. 1–7 Nov. 1992.

Boning, D. et al. "Statistical metrologyof interlevel dielectric thickness variation"0 Proceedings of the SPIE, vol. 2334, pp. 316–327 Oct. 1994.

*Primary Examiner*—R. Bruce Breneman
*Assistant Examiner*—Anita Alanko
*Attorney, Agent, or Firm*—Benman, Collins & Sawyer

[57] ABSTRACT

A method for developing and characterizing a polish process for polishing an interlayer dielectric (ILD) layer for a specific product or a specific patterned metal layer is provided. A statistically-based model for ILD planarization by chemical mechanical polish (CMP) is used as a guide to determine, in an empirical manner, the proper amount of ILD polishing that will be required to planarize an ILD layer. The statistically-based model also shows the resulting ILD thicknesses to be expected. By relating the blank test wafer polished amount to the maximum amount of oxide removed from the field areas in the die and the total indicated range across the die, the ILD deposition thickness can be adjusted to attain the desired planarized ILD thickness. The attainment of local planarity, however, must be confirmed by an independent measurement technique. The polish process development methodology is extendible with respect to minimum interconnect feature size. This polish process development methodology can also be applied to products requiring multiple planarizations for multiple levels of interconnects.

24 Claims, 4 Drawing Sheets

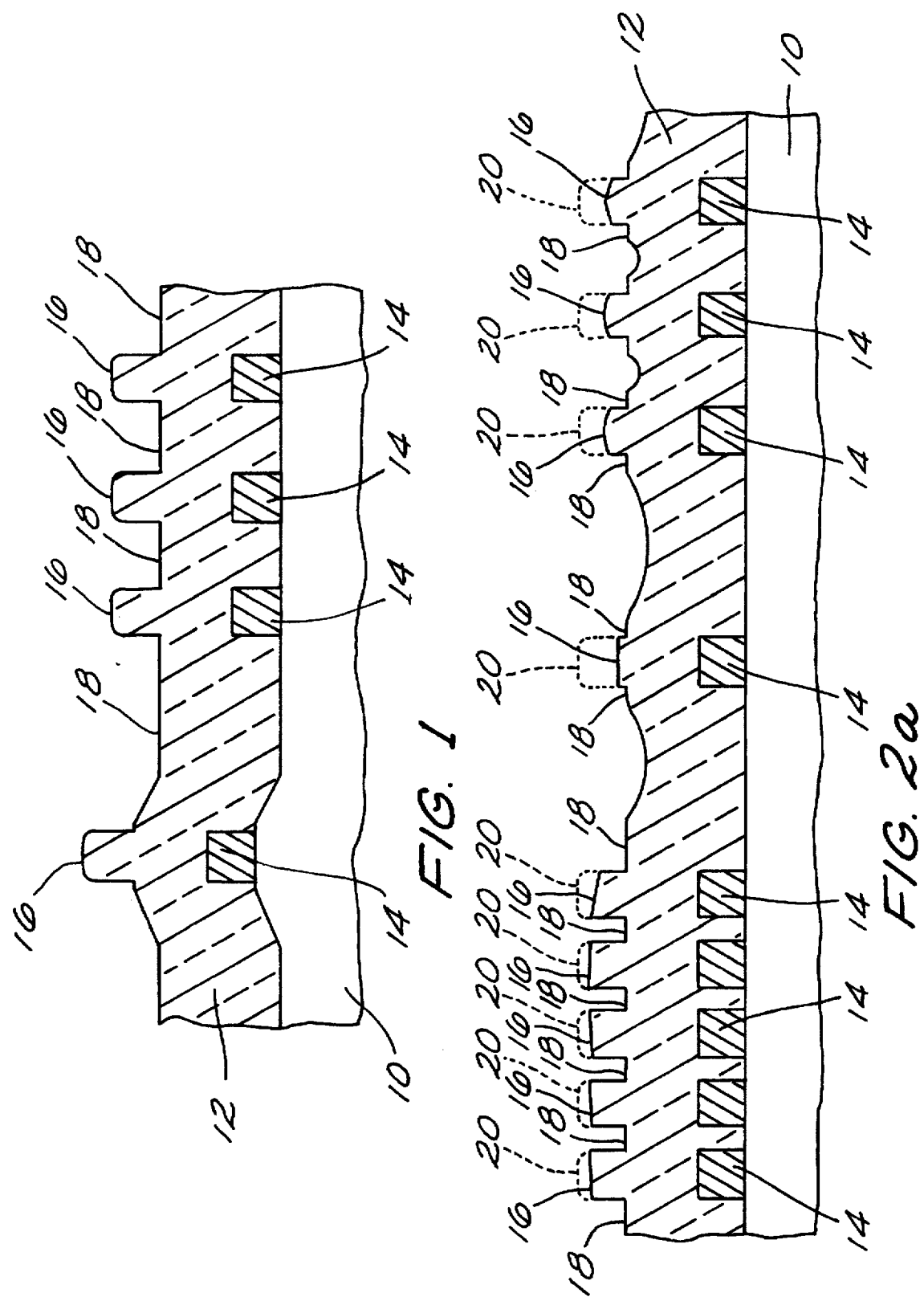

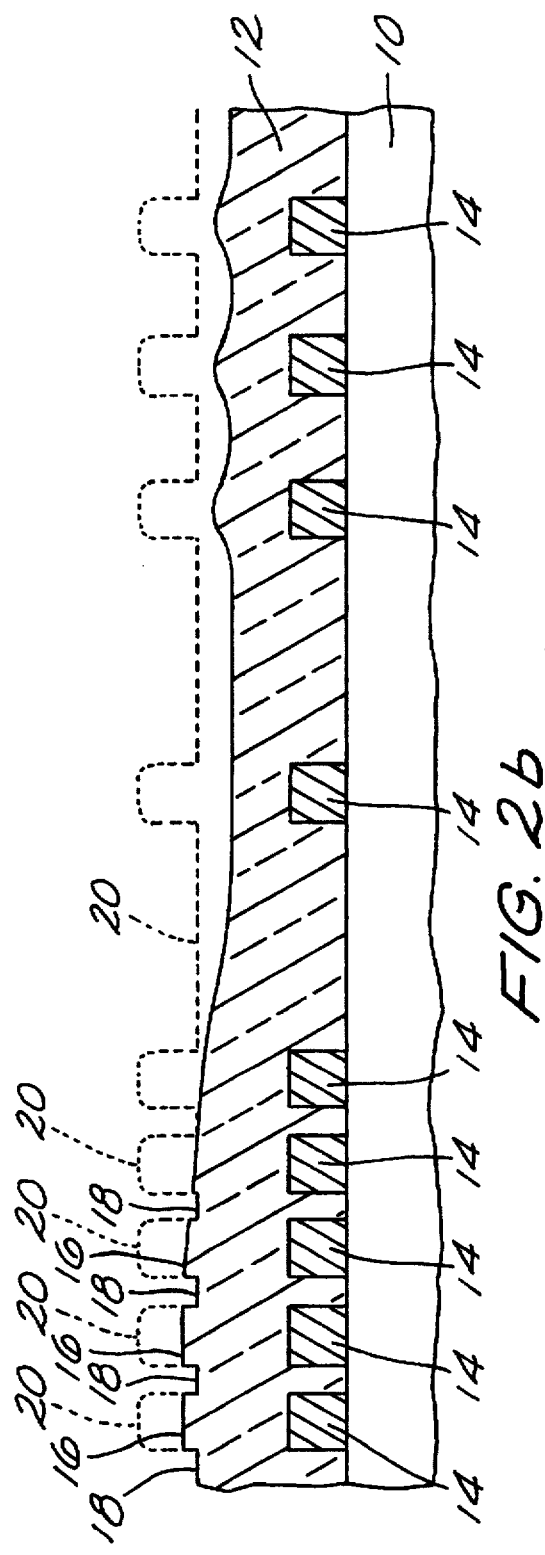
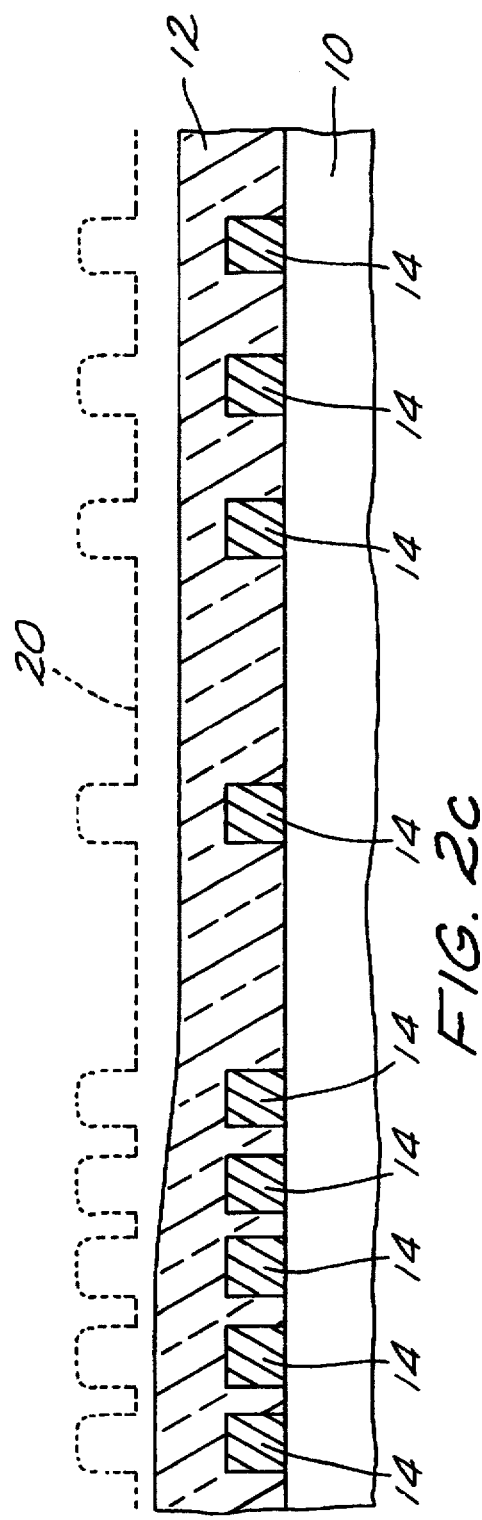
FIG. 2b
FIG. 2c

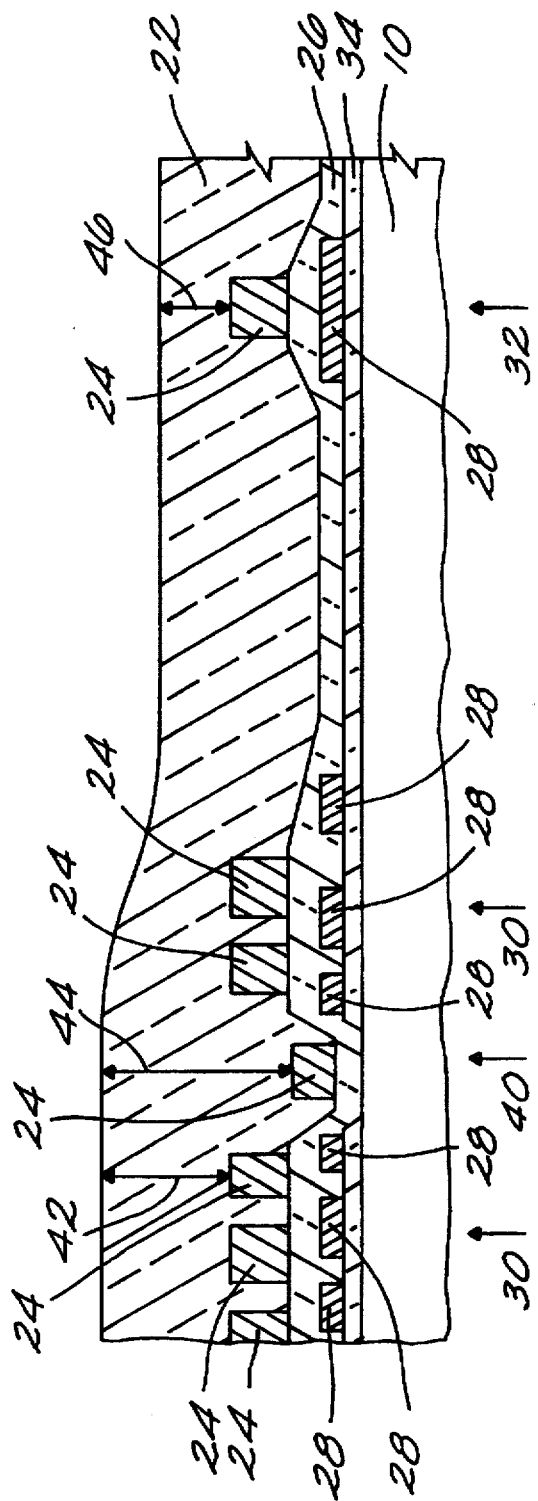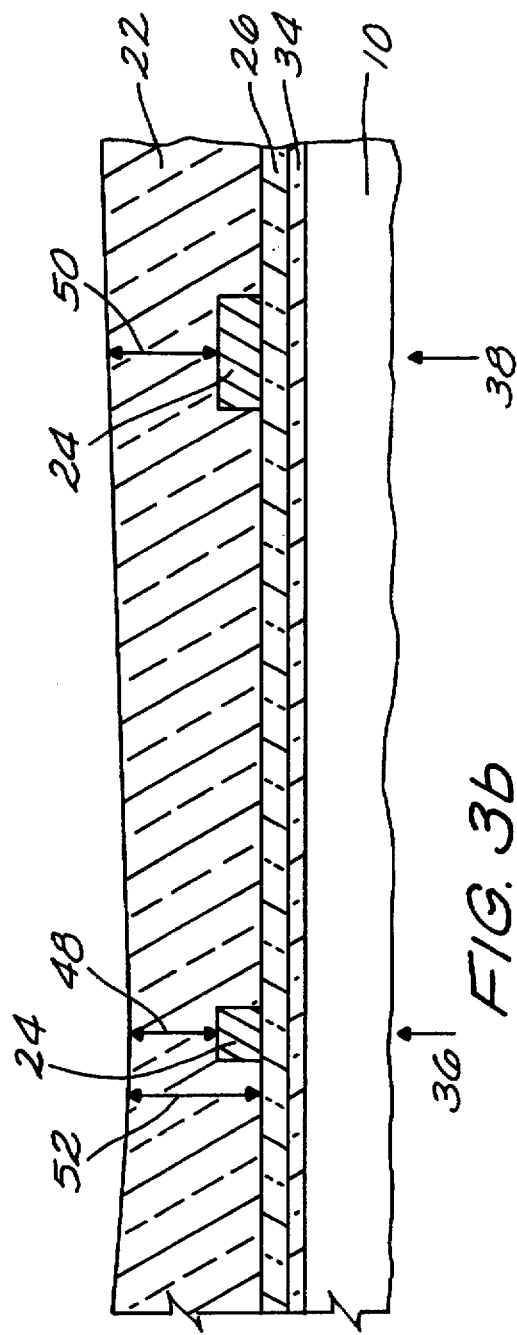

METHODOLOGY FOR DEVELOPING PRODUCT-SPECIFIC INTERLAYER DIELECTRIC POLISH PROCESSES

TECHNICAL FIELD

The present invention relates generally to semiconductor processing, and, more particularly, to chemical mechanical polishing and the characterization and development of polish processes for interlayer dielectric (ILD) planarization.

BACKGROUND ART

Chemical-mechanical polishing (CMP) is widely employed to planarize ILD layers used to isolate metal connections formed from patterned metal layers deposited on semiconductor wafers. Planarization of ILD layers by CMP is a technique that relies on the removal of oxide from the wafer surface at locally different rates. The local rate of removal of oxide depends on the pattern density of the patterned metal layer and/or underlayer. In this context, the underlayer corresponds to the surface on which the patterned metal layer and the ILD layer are formed. With the proper amount of polishing under well-controlled pad, slurry, and surface speed conditions, all local steps are removed from the surface of the ILD layer. Local planarity is essentially 100%.

The long-range behavior with CMP is also significantly improved over competing smoothing techniques such as resist/spin-on-glass etchback or deposit-etch-deposit, i.e., dep-etch-dep, processes. CMP, however, offers less than perfect planarity. Global planarity ranging from 60% to 80% is typical for CMP of surface features present in ILD layers in logic/memory devices. In this context, global refers to the area defined by repeating die or reticle patterns and global planarity of 60% to 80% corresponds to a planarized surface being 60% to 80% more planar than the surface topography measured across a reticle pattern or stepper field before polishing.

Nevertheless, as a means of ILD planarization, chemical-mechanical polish offers significant processing advantages. The combination of local planarity and low-defect processing improves metal yields by reducing shorts from tungsten stringers and nodules. Furthermore, the much-improved planarity over the range of the stepper field assists in printing deep-submicrometer geometries where depth-of-focus limitations become important.

The issues that must be understood, characterized, and controlled with ILD polish planarization fall into two categories: (a) a process must always achieve local planarity while maximizing global planarity; and (b) a process must result in a controlled, uniform, and reproducible ILD thickness.

What is needed is a method for characterizing and developing polish processes for specific semiconductor product wafers that achieves local planarity while maximizing global planarity and results in a controlled, uniform, and reproducible ILD thickness.

DISCLOSURE OF INVENTION

In accordance with the invention, a method for characterizing and a method for subsequently developing a polish process for polishing semiconductor product wafers is provided. Each of the semiconductor product wafers comprises a film coating having a film coating thickness deposited over patterned features on an underlayer. The polishing is used to remove steps in the film coating caused by the patterned features. Each of the semiconductor product wafers also comprises a plurality of identical die sites across the semiconductor product wafer.

The method of the invention for characterizing a polish process comprises:

(a) polishing a first patterned test wafer selected from the semiconductor product wafers for a time long enough to remove an amount of film coating equal to the step height of the patterned features;

(b) determining four locations within a single die on the first patterned test wafer corresponding to (i) a location at or near the location of maximum removal of the film coating, (ii) a location at or near the location of minimum removal of the film coating, (iii) a first position over a measurable topographic feature and (iv) a second position adjacent the first position in a region not over the patterned features;

(c) measuring the film coating thickness at the four locations on the first patterned test wafer;

(d) determining the highest point on the film coating within the single die;

(e) measuring the difference between the film coating thickness at the highest point and the location at or near the location of minimum removal;

(f) adding the difference in the film coating thickness between the highest point and the location at or near the location of minimum removal to the difference between the film coating thickness at the location at or near the location of minimum removal and the location at or near the location of maximum removal to calculate a total indicated range;

(g) determining the total indicated range variation; and (h) calculating the maximum step height for a worst case step in the film coating.

The method of the invention for developing a polish process for polishing the semiconductor product wafers after completing characterization comprises:

(a) selecting at least one additional patterned test wafer from the semiconductor product wafers;

(b) selecting a removal target for each of the additional patterned test wafers such that the maximum step height for the worst case step in the film coating is maintained below a designated step height;

(c) measuring the film coating thickness of each of the additional patterned test wafers at the four locations;

(d) polishing each of the additional patterned test wafers for a time long enough to remove an amount of film coating equal to each of the removal targets;

(e) measuring the film coating thickness at the four locations on each of the additional patterned test wafers;

(f) determining the total indicated range and the total indicated range variation for each of the additional patterned test wafers;

(g) inspecting each of the additional patterned test wafers for steps in the film coating;

(h) choosing an optimum removal target for processing the semiconductor product wafers.

At least one of the semiconductor product wafers is chosen as a patterned test wafer to be used to collect data and to verify that the maximum step height for the worst case step is smaller than the designated step height. An appropriate amount of film coating to be deposited is also re-calculated.

Polishing is accomplished using chemical mechanical polishing. A spreadsheet based on a statistically-based model of the polish process is used in calculating the maximum step height for a worst case step in the interlayer dielectric layer, in choosing an optimum removal target for processing the remaining wafers in the lot, and in calculating an appropriate amount of film coating to be deposited.

At least one of the semiconductor product wafers in at least one additional lot is chosen to be a patterned test wafer for collecting data and refining the statistically-based model. The film coating measured at the location at or near the location of maximum removal and at the second position in the region not over the patterned features for each of the lots are averaged. The total indicated range and the total indicated range variation for each of the lots is also averaged. These average values are used to create a new spreadsheet.

This methodology can be successfully applied to technologies (1) ranging in feature size from 0.7 µm to 0.35 µm or smaller, (2) having from four to five or more conductor levels, and (3) requiring from two to four or more ILD polish planarizations.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIG. 1 is a cross-sectional view depicting one region of a semiconductor substrate where an ILD layer has been deposited over a patterned metal layer;

FIGS. 2a–2c are cross-sectional views depicting the smoothing of the surface features at the surface of an ILD layer with continuous polishing;

FIGS. 3a–3b are cross-sectional views depicting a generalized topographical structure after polishing.

BEST MODES FOR CARRYING OUT THE INVENTION

Figure 4:
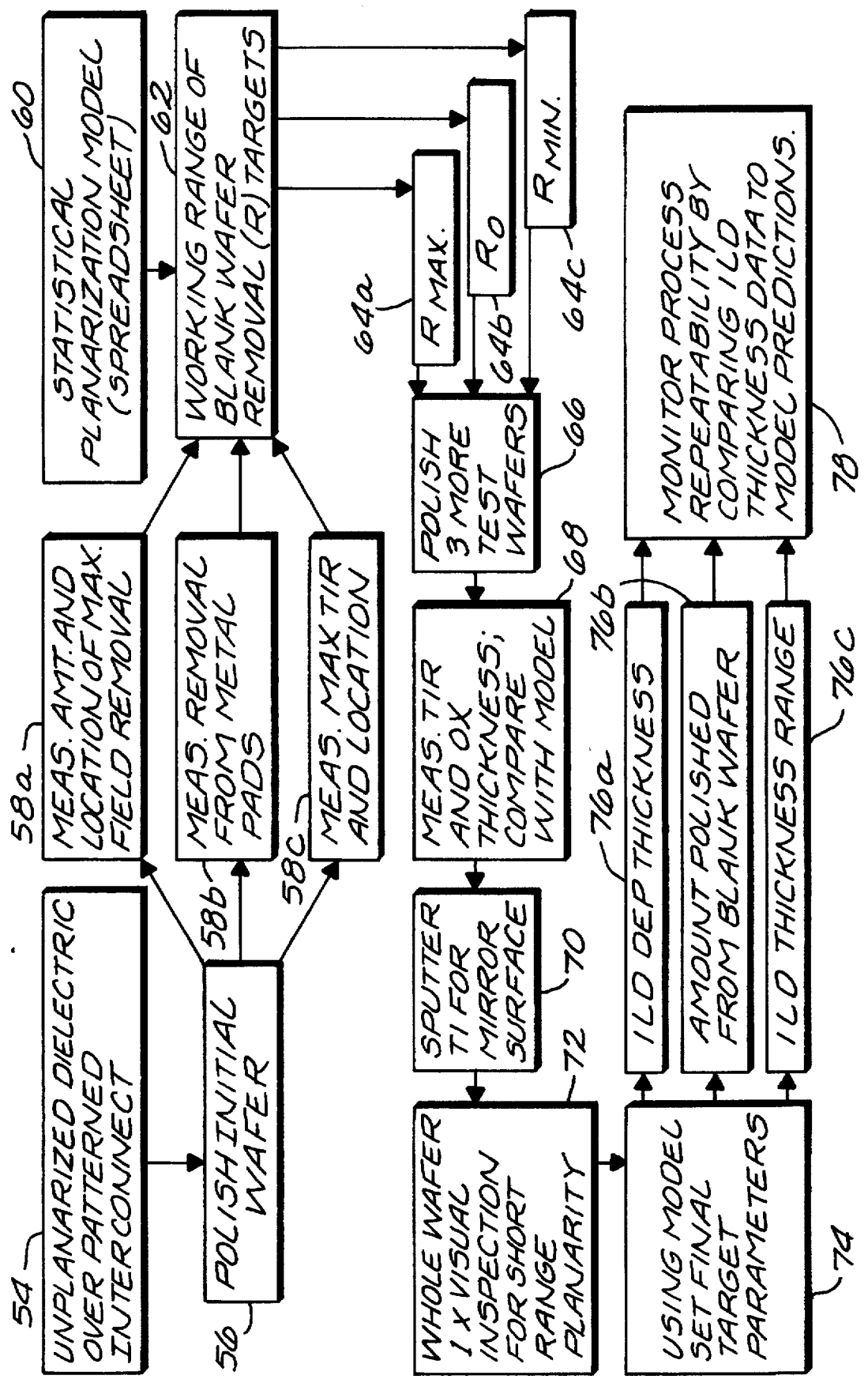
FIG. 4 is a flow chart schematically showing a process of the invention.

Reference is now made in detail to a specific embodiment of the present invention, which illustrates the best mode presently contemplated by the inventors for practicing the invention. Alternative embodiments are also briefly described as applicable.

FIG. 1 depicts one region of a semiconductor substrate 10 where an oxide layer 12 has been deposited over a patterned metal layer 14. The oxide layer, or ILD layer, 12 formed on the patterned metal layer 14 results in an elevated surface plane or up areas 16 and a recessed surface plane or down areas 18. The up areas 16 and the down areas 18 are roughly proportional in area to the metal regions corresponding to the patterned metal layer 14, and field areas, respectively. Additionally, the patterned metal layers 14 may not all lie in the same plane. As shown in FIG. 1, steps from the underlying structure will create a deposited oxide surface topography that is a convolution of patterns in the patterned metal layer 14 and underlayer.

The CMP technique which is employed to planarize the wafer surface provides a means of attaining a high degree of both short-range and long-range planarity on the surface of the ILD layer 12. FIGS. 2a–2c displays the progressive oxide removal at the surface of the ILD layer 12 with continuous polishing and the consequent smoothing of the surface features. The dotted line 20 in FIGS. 2a–2c indicates the surface of the ILD layer 12 prior to CMP. Prior to completion of CMP, the surface of the ILD layer 12 possesses local steps which include steps between the up areas 16 and the down areas 18 above the patterned metal layers 14 as well as other steps in the ILD layer produced by steps in the underlayer pattern. Upon completion of CMP, all local steps are removed from the surface of the ILD layer 12. Local planarity is essentially 100% as a result of the high differential in polish rates for up areas 16 and down areas 18 associated with abrupt local steps.

Global planarity, however, is less than 100%. This non-planarity occurs because physical bending of the polishing pad occurs on a comparable scale with the dimensions of the large ILD field areas on the device. Accordingly, the polish rate differential between these broad up areas and broad down areas is not infinitely large.

To help understand and resolve the issues regarding planarity of the ILD surface and thickness control of the ILD layer 12, a statistically-based model for ILD planarization by CMP has been developed. The simple, statistically-based model accounts for the range in thickness variation expected for an ILD layer 12 planarized by CMP. The model is designed to track the cumulative random variation in the thickness of the ILD layer 12, introduced at each of the dielectric processing steps. In addition, the systematic variation in the thickness of the ILD layer 12 unique to polish planarization is considered for the thick and thin extreme cases.

The random variation, described above, is the +<3σ> to −<3σ> distribution of possible ILD thickness resulting from all ILD processing steps. These values represent the possible extremes and will not be found on any given wafer or even any given run. The random variation in ILD thickness is correlated with the thickness of the patterned metal layer 14 and the amount of ILD deposited and removed by polishing.

The systematic variation in thickness, described above, is due to (1) the structurally different environments that lie beneath the ILD layer 12 and (2) the total indicated range (TIR), which is pattern-dependent, for each product. TIR corresponds to the variation on the surface of the wafer from the highest point to the lowest point over one die within the wafer. For these planarization processes, which are optimized for local planarity and ILD thickness variation, the magnitude of the TIR of the ILD surface is principally governed by (1) the pattern density of the patterned metal layer 14 and how the pattern density is distributed across the die and (2) the step height of steps in the patterned metal layer and the underlayer.

Every die on any wafer will exhibit systematic variation in ILD thickness. The first polished layer for any product shows quite a large systematic variation of ILD thickness because of the effects of underlying topography. Subsequent polished layers show a reduced systematic variation in the ILD surface, which is caused mostly by the TIR of the ILD surface after polish.

To illustrate the use of the statistically-based model for ILD planarization by CMP, consider, as an example, planarization of ILD layer #1 (film coating) 22 which is shown schematically in FIGS. 3a–3b. A generalized topographical structure is shown after polish. The generalized topographical structure has been split into two segments. One segment is shown in FIG. 3a while the other segment is shown in FIG. 3b. The left side of the segment depicted in FIG. 3b is a continuous extension of the right side of the segment depicted in FIG. 3a. The individual segments are joined to complete the generalized topographical structure.

Represented in the cross-sectional view are patterned metal structures (patterned features) 24 formed on a base ILD layer 26 at six structurally different locations or sites on the die. The patterned metal structures 24 may comprise metal lines or metal pads. The wafer comprises a plurality of identical die, i.e., product die or chips (e.g., microprocessors) which are repeated across the wafer. Accordingly, these six structurally different locations or sites can be found within other die sites across the wafer. The patterned metal structures 24 are depicted running over polysilicon structures 28 in both a location 30 where there are dense regions of polysilicon structures and a location 32 where an isolated polysilicon structure resides. The patterned metal structures 24 are also depicted lying over field oxide 34 at two locations in the field areas, location 36 and location 38, and running down over a source/drain region 40 adjacent the dense regions of polysilicon structures 28. The patterned metal structure 24 at location 38 is a metal pad which will be used as a measurement pad.

The different thicknesses of ILD layer #1 22 after CMP are shown. Thickness 42 corresponds to the thickness of ILD layer #1 22 above the patterned metal structures 24 at the location 30 where there are dense regions of polysilicon structures 28. Thickness 44 corresponds to the thickness of ILD layer #1 22 above the source/drain region 40 adjacent the dense regions of polysilicon structures 28. Thickness 46 corresponds to the thickness of ILD layer #1 22 above the patterned metal structure 24 at location 32 where an isolated polysilicon structure 28 resides. Thickness 48 and thickness 50 correspond to the thickness of ILD layer #1 22 above the patterned metal structures 24 lying over field oxide 34 in the field area at the location 36 and location 38.

The locations of maximum and minimum polish found across the die are identified in the drawings in FIGS. 3a–3b. Location 30 and the source/drain region 40 correspond to the locations of minimum polish as indicated by thickness 42 and thickness 44, respectively. Thickness 52 corresponds to the thickness of maximum polish and is located adjacent location 36.

The two extremes in thickness of ILD layer #1 22 found across the die are identified in FIGS. 3a–3b as well. The maximum thickness is thickness 44 and corresponds to the thickness of ILD layer #1 22 over the source/drain region 40 in the area of minimum polish. The minimum thickness is thickness 46 and corresponds to the thickness of ILD layer #1 22 over the isolated patterned metal structure 24 formed over an isolated polysilicon structure 28 at location 32. As described above, the generalized topographical structure has been split into two segments and the left side of the segment depicted in FIG. 3b is a continuous extension of the right side of the segment depicted in FIG. 3a. Accordingly, the minimum thickness at location 32 is in the area of maximum polish which was described above as being adjacent location 36.

The different thicknesses outlined above are influenced by the different structures that lie beneath ILD layer #1 22. What is implied in FIGS. 3a–3b is that the locations of maximum and minimum thickness are uniquely determined by the pattern layout of the patterned metal structures 24 and the underlayer. The locations of maximum and minimum thickness will never vary for the same pattern, but will be different for each new pattern. It should be emphasized that different product types, different test chips with mixed products and/or test tiles, and different metal layers within a product, will show different global planarity after CMP. The variations in global planarity will include differing ILD thicknesses and differing cross-die distributions of ILD thickness.

Table I shows a spreadsheet displaying the results of calculations of the thickness of ILD layer #1 22 above the different structures shown in FIGS. 3a–3b. The data in the spreadsheet represents the thickness of ILD layer #1 22 for a semiconductor product wafer etched and polished with a 4 kÅ polisher (Westech 372/472, IPEC/Westech Inc., Phoenix, Ariz.). Both the nominal and worst case are considered. The first column of the spreadsheet lists six process steps that directly affect the thickness of ILD layer #1 22. The first item in this first column, metal step height, relates to the height of the metal steps in the patterned metal structures 24. The remaining five items in the first column include: spacer PETEOS (plasma enhanced tetra-ethyl orthosilicate) deposition, RIE (reactive ion etch) spacer etch, ILD PETEOS deposition, oxide wet etch, and polish. The polish step is broken down into multiple entries for TIR, for the blank test wafer polish amount, for the polish amount over each of the six structurally-different sites on the die, as well as for the polish amount over the worst case step in the ILD surface, and for an additional measurement adjacent a measurable topographic feature, e.g., a measurement pad, to be discussed more fully below. The blank test wafer polish amount corresponds to the amount of ILD removed from the surface of a blank test wafer. For the case of the generalized topographic structure shown in FIGS. 3a–3b, the worst case step in the ILD surface corresponds to the ILD layer #1 22 above the dense region of patterned metal structures 24 at the location 30 where there are dense regions of polysilicon structures 28. The definition of the worst case step will be different for each product design. The definition of the worst case step will depend on the spacing and the process technology design rules as well.

The third and fourth column, list the nominal value of the specification target for the individual unit processes and the total <3σ> process envelope (abbreviated <3σ>), respectively, for each of the process steps. The second column lists the percent variation (abbreviated % var) in the specification target and relates directly to the value of the total <3σ> process envelope in the fourth column. In the remaining columns of the table, the nominal value of the cumulative thickness of ILD layer #1 22 and the cumulative variation in the thickness of ILD layer #1 are tracked for each process step at the six structurally-different sites. The total <3σ> process envelope and cumulative variation include the variation in the ILD thickness within a single wafer, from wafer to wafer and from lot to lot.

The maximum and minimum possible thickness of ILD layer #1 22 above each of the six structurally-different sites on the die are computed from the cumulative thicknesses and the cumulative variations. The maximum ILD thickness and minimum ILD thickness values are displayed in the bottom three rows of Table I along with the calculated range of ILD thickness (maximum delta). The calculated range of ILD thickness, is calculated from the difference between the largest maximum possible thickness of ILD layer #1 22 and the smallest minimum possible thickness. Tables IIa and IIb list the cell definitions for Table I.

Table III tracks the step height in the ILD surface caused by the patterned metal structures 24 through the remaining five other process steps that directly affect the thickness of ILD layer #1 22. Table III includes the step height for both the nominal case for each of the six structurally-different sites as well as the worse case step in the ILD surface. The first four columns are identical to the first four columns of Table I. The next two columns list the nominal step height and the cumulative variation (abbreviated <3σ>) in the step height introduced by each process step. The remaining two columns list the maximum and minimum possible step heights based on the sum and difference of the nominal value and cumulative variation for each process step. After polish, the maximum step height on the ILD surface caused by the underlying structures at the six structurally different sites considered should have a negative value, i.e., the step has been removed. Negative steps heights imply local planarity. Table IV lists the cell definitions for the spreadsheet shown in Table III.

The entries in the spreadsheet can be categorized as (1) constants, (2) independent variables, (3) dependent variables with pattern dependencies, (4) dependent variables with structural dependencies, and (5) process outputs.

The entries for the metal step height, spacer PETEOS deposition, and RIE spacer etch can be treated as constants, with normal variation for the wafers incoming to ILD planarization. The metal step height and metal step height variation are specification targets determined from process capability data. The spacer PETEOS deposition, and RIE spacer etch are also specification targets determined from PETEOS deposition and spin-on-glass specifications and the spacer etch back specifications. Also, the minimum allowable ILD thickness is fixed by design considerations.

TABLE I

SPREADSHEET DISPLAYING CALCULATED ILD THICKNESS

| | A | B | C | D | E | F | G | H | I | J | K | L | M | N | O | P |
|---|---|---|---|---|---|---|---|---|---|---|---|---|---|---|---|---|
| | | | SPECIFICATION TARGET & TOTAL PROCESS ENVELOPE | | | | CUMULATIVE THICKNESS & CUMULATIVE VARIATION | | | | | | | | | |
| | | | | | ILD/ fld ox (max removal) | | ILD/metal/ fld ox (max removal) | | ILD/metal/ active (adj dense poly) | | ILD/metal/ isolated poly | | ILD/ dense metal/ dense poly | | ILD/metal/ fld ox (meas pad) | |
| | PROCESS STEP | %VAR | NOMINAL | 3σ | NOMINAL | 3σ | NOMINAL | 3σ | NOMINAL | 3σ | NOMINAL | 3σ | NOMINAL | 3σ | NOMINAL | 3σ |
| | METAL STEP HEIGHT - NOMINAL -WORST CASE | 13% | 7950 13050 | 1034 1121 | | | | | | | | | | | | |
| | SPACER PETEOS DEPOSITION | 7% | 4500 | 315 | 4500 | 315 | 4500 | 315 | 4500 | 315 | 4500 | 315 | 4500 | 315 | 4500 | 315 |
| | RIE SPACER ETCHBACK | 12% | -4000 | 480 | 500 | 674 | 500 | 574 | 500 | 574 | 500 | 574 | 500 | 574 | 500 | 574 |
| | ILD PETEOS DEPOSITION | 7% | 22000 | 1540 | 22500 | 1644 | 22500 | 1644 | 22500 | 1644 | 22500 | 1644 | 22500 | 1644 | 22500 | 1644 |
| | OXIDE WET ETCH | 12% | -7500 | 923 | 22500 | 1644 | 15000 | 1885 | 15000 | 1885 | 15000 | 1885 | 15000 | 1885 | 15000 | 1885 |
| | POLISH - TIR | | 322 | 189 | | | | | | | | | | | | |
| | POLISH - TEST WAFER | 25% | -4000 | 1000 | | | | | | | | | | | | |
| | -ILD/fld ox (max removal) | | -4142 | 1000 | 18358 | 1924 | | | | | | | | | | |
| | -ILD/metal/fld ox (max removal) | | -4592 | 1018 | | | 10408 | 2371 | | | | | | | | |
| | -ILD/metal/active (adj dense poly) | | -3170 | 1000 | | | | | 11830 | 2378 | | | | | | |
| | -ILD/metal/isolated poly | | -8592 | 1018 | | | | | | | 6408 | 2371 | | | | |
| | -ILD/dense metal/dense poly | | -8270 | 1018 | | | | | | | | | 6730 | 2378 | | |
| | -WORST CASE STEP IN ILD | | -8270 | 1018 | | | | | | | | | | | | |
| | -ILD/fld ox (adj meas pad) | | -4073 | 1000 | | | | | | | | | | | | |
| | -ILD/fld ox (meas pad) | | -4523 | 1000 | | | | | | | | | | | 10477 | 2371 |
| | MAXIMUM ILD THICKNESS | | | | | | 12779 | | 14208 | | 8779 | | 9108 | | 12848 | |
| | MINIMUM ILD THICKNESS | | | | | | 8037 | | 9452 | | 4037 | | 4352 | | 8106 | |
| | MAXIMUM DELTA | | | | | | | | 10171 | | | | | | | |

TABLE IIa

CELL DEFINITIONS FOR SPREADSHEET (TABLE I)

| | |
|---|---|
| C11 | Specification target, from process capability data |
| C12 | C11 + polysilicon step + field oxide step = C11 + 4000 + 1100 = C11 + 5100 |
| C14 | Specification target |
| C15 | Specification target |
| C16 | Specification target |
| C17 | Specification target |
| C19 | Die site TIR = minimum removal in field area - maximum removal in field area + Tencor P1/P2 reading (from layer characterization) |
| C20 | Specification target for unpatterned polish monitor (i.e., blank test wafer) |
| C21 | Maximum ILD removed from a field area in the die site (from layer characterization) |
| C22 | ILD removed from atop metal feature in location of maximum removal = C21 − (C11 + C17) |
| C23 | ILD removed from atop metal feature over source/drain area at location of maximum TIR = C22 + 1100 + C19 |
| C24 | ILD removed from atop metal feature over isolated polysilicon feature(s) in location of maximum removal = C22 − 4000 |
| C25 | ILD removed from atop metal feature over dense polysilicon features at location of maximum TIR = C22 − 4000 + C19 |
| C26 | ILD removed from atop features creating WORST CASE STEP IN ILD SURFACE = C22 − 4000 + C19 |
| C27 | ILD removed from field area adjacent measurement pad location (from layer characterization) |
| C28 | ILD removed from atop measurement pad |

TABLE IIb

CELL DEFINITIONS FOR SPREADSHEET (TABLE I)

| | |
|---|---|
| D11 | Specification limits, from process capability data |
| D12 = SQRT(D11$^2$ + 434$^2$) | |
| D14 through D17 | Specification limits |
| D19 | From layer characterization |
| D20 | Specification limits |
| D21 = D20 | |
| D22 = D20 | |
| D23 = SQRT(D20$^2$ + D19$^2$) | |
| D24 = D20 | |
| D25 = SQRT(D20$^2$ + D19$^2$) | |
| D26 = SQRT(D20$^2$ + D19$^2$) | |
| D27 = D20 | |
| D28 = D20 | |
| E17 = C14 + C15 + C16 | |
| G17, I17, K17, M17, O17 = C14 + C15 + C16 + C17 | |
| E21 = E17 + C21 | F21 = SQRT(D14$^2$ + D15$^2$ = D16$^2$ + D21$^2$) |
| G22 = G17 + C22 | H22 = SQRT(D14$^2$ + D15$^2$ + D17$^2$ + D22$^2$ + D11$^2$) |
| I23 = I17 + C23 | J23 = SQRT(D14$^2$ + D15$^2$ + D17$^2$ + D23$^2$ + D11$^2$) |
| K24 = K17 + C24 | L24 = SQRT(D14$^2$ + D15$^2$ + D17$^2$ + D24$^2$ + D11$^2$) |
| M25 = M17 + C25 | N25 = SQRT(D14$^2$ + D15$^2$ + D17$^2$ + D25$^2$ + D11$^2$) |
| O28 = O17 + C28 | P28 = SQRT(D14$^2$ + D15$^2$ + D17$^2$ + D28$^2$ + D11$^2$) |
| G31, I31, K31, M31, O31 = G22, I23, K24, M25, O28 + H22, J23, L24, N25, P28 | |
| G32, I32, K32, M32, O32 = G22, I23, K24, M25, O28 − H22, J23, L24, N25, P28 | |
| I34 = Extreme ILD thickness range | |

TABLE III

SPREADSHEET DISPLAYING CALCULATED STEP HEIGHT IN ILD SURFACE

| | SPECIFICATION TARGET & TOTAL PROCESS ENVELOPE | | | STEP HEIGHT | | | |
|---|---|---|---|---|---|---|---|
| PROCESS STEP | % VAR | NOMINAL | <3σ> | NOMINAL | <3σ> | MAXIMUM | MINIMUM |
| METAL STEP HEIGHT - NOMINAL | 13% | 7950 | 1034 | 7950 | 1034 | 8984 | 6917 |
| - WORST CASE | | 13050 | 1121 | 13050 | 1121 | 14717 | 11929 |
| | | | | | | | |
| SPACER PETEOS DEPOSITION | 7% | 4500 | 315 | | | | |
| RIE SPACER ETCHBACK | 12% | -4000 | 480 | | | | |
| ILD PETEOS DEPOSITION | 7% | 22000 | 1540 | | | | |
| OXIDE WET ETCH | 12% | -7500 | 923 | 450 | 1385 | 1835 | -935 |
| | | | | | | | |
| POLISH - TIR | 25% | 322 | 189 | | | | |
| POLISH - TEST WAFER | | -4000 | 1000 | | | | |
| -ILD/fld ox (max removal) | | -4142 | 1000 | -4142 | 1709 | -2433 | -5851 |
| -ILD/metal/fld ox (max removal) | | -4592 | 1018 | -2720 | 1719 | -1001 | -4439 |
| -ILD/metal/active (adj dens poly) | | -3170 | 1000 | | | | |
| -ILD/metal/isolated poly | | -8592 | 1018 | -8142 | 1709 | -6433 | -9851 |
| -ILD/dense metal/dense Poly | | -8270 | 1018 | -7820 | 1719 | -6101 | -9539 |
| -WORST CASE STEP IN ILD | | -8270 | 1018 | -2720 | 1773 | -947 | -4493 |
| -ILD/fld ox (adj meas pad) | | -4073 | 1000 | | | | |
| -ILD/metal/fld ox (meas pad) | | -4523 | 1000 | -4073 | 1709 | -2364 | -5782 |

TABLE IV

CELL DEFINITIONS FOR SPREADSHEET (TABLE III)

G11 = C11      H11 = D11
G12 = C12      H12 = D12
G17 = G11 + E17
G22 = G11 + E17 + E22
G23 = G11 + E17 + E23
G24 = G11 + E17 + E24
G25 = G11 + E17 + E25
G26 = G11 + E17 + E26
G27 = G11 + E17 + E27
H17 = SQRT(H11$^2$ + F17$^2$)
H22 = SQRT(H11$^2$ + F17$^2$ + F22$^2$)
H23 = SQRT(H11$^2$ + F17$^2$ + F23$^2$)
H24 = SQRT(H11$^2$ + F17$^2$ + F24$^2$)
H25 = SQRT(H11$^2$ + F17$^2$ + F25$^2$)
H26 = SQRT(H11$^2$ + F17$^2$ + F26$^2$)
H28 = SQRT(H11$^2$ + F17$^2$ + F28$^2$)
I = G + H      Negative step heights imply local planarity.
J = G − H The blank test wafer polish amount and the amount of oxide wet etch, if applicable, are considered to be adjustable independent variables. Both the polish amount from the blank test wafer and the amount of oxide wet etch are specification targets. The amount of oxide wet etch is determined from oxide wet etch specifications.

Three variables with pattern layout dependencies are (a) the maximum amount of ILD removed from the field area in a die, when polished for the same time as the blank test wafer, (b) the amount of ILD removed from the field area near a measurable topographic feature, i.e., adjacent a measurement pad, and (c) the TIR in the ILD surface across the die. In this case, the measurable topographic feature is metal pad or measurement pad which is intentionally incorporated in the product design for the ease of measurement. Each of these variables have an average value and a variation associated with them. The average value of each of these variables as well as the variation in TIR is determined from ILD layer characterization to be discussed more fully below. The variation in the maximum amount of ILD removed from the field area in a die and the amount of ILD removed from the field area adjacent the measurement pad are determined by the specification limits. The term specification limits can also be referred to as semiconductor process control limits.

There are five quantities derived from the above variables that have structure dependency, i.e., these quantities are dependent on the structures beneath the layer to be planarized. These quantities represent the amount of ILD layer #1 22 polished (or removed) from the five structurally-different sites on the die that are tracked in the statistically-based model. These quantities cover the range in systematic variation in ILD thickness induced by polish. Table I lists these five structurally-different sites on the die as: (1) ILD/metal/field oxide (maximum removal), (2) ILD/metal/active (adjacent dense polysilicon), (3) ILD/metal/isolated polysilicon, (4) ILD/dense metal/dense polysilicon, and (5) ILD/metal/field oxide (measurement pad). The terms for these five structurally-different sites on the die may be abbreviated in Table I and Table III. These five structurally-different sites on the die, which are identified in FIGS. 3a–3b, correspond to: (1) the location of maximum polish adjacent location 36, (2) the source/drain region 40 adjacent the dense regions of polysilicon structures 28, (3) location 32 where an isolated polysilicon structure resides, (4) location 30 where there are dense regions of polysilicon structures, and (5) location 38 where one of the patterned metal structures 24 which serves as a measurement pad is depicted lying over field oxide 34 in the field area. The thickness of ILD layer #1 22 at these sites can be calculated by knowing the size of the structures lying beneath the ILD layer #1, some specification target data (i.e., amount of oxide wet etch), as well as values obtained from ILD layer characterization, (i.e., TIR and maximum amount of ILD removed from a field area in the die).

The ILD PETEOS deposition thickness can be considered a dependent variable, whose value is chosen to yield the desired thickness range for ILD layer #1 22 after polish planarization.

Finally, the process outputs are the maximum thickness of ILD layer #1 22, and the calculated range in ILD thickness. As indicated above the calculated range of ILD thickness is calculated from the difference between the largest maximum possible thickness of ILD layer #1 22 and the smallest minimum possible thickness. The range of ILD thickness gives the range in possible via depths, and provides a gauge of local planarity.

The maximum step height for the worst case step in the ILD surface is also a process output and is shown in Table III. In this case, the nominal value of the worst case step in the ILD surface, is derived from the step height of the patterned metal structures 24, the polysilicon structures 28, and the field oxide 34 and takes into consideration the TIR across the die and the effects of the oxide wet etch. The maximum step height for the worst case step in the ILD surface is determined from the nominal value for the step height and the cumulative variation in step height, for the worst case step.

The maximum step height for the worst case step is defined in the spreadsheet as: (i) the sum of the average total indicated range, (ii) the interlayer dielectric thickness at the location of maximum removal of the interlayer dielectric layer over the field areas, (iii) the thickness of the field oxide, (iv) the square of the semiconductor process control limits from metal step height specifications, (v) the square of the semiconductor process control limits from oxide wet etch specifications, (vi) the square of the semiconductor process control limits from polishing specifications, (vii) the square of the total indicated range variation, (viii) the square of the variation in the step height of the polysilicon structures and (ix) the square of the step height of the field oxide.

The statistically-based model for ILD planarization by CMP, is embodied in the spreadsheet shown in Table I and Table III. This statistically-based model can be used as a guide to determine, in an empirical manner, the proper amount of ILD polishing that will be required to planarize an ILD layer 12. The statistically-based model also shows the resulting ILD thicknesses to be expected. In brief, by relating the blank test wafer polished amount to the maximum amount of oxide removed from the field areas in the die and the TIR across the die, the ILD deposition thickness can be adjusted to attain the desired planarized ILD thickness. The attainment of local planarity, however, must be confirmed by an independent measurement technique.

The statistically-based model for ILD planarization by CMP can be used to characterize and/or develop a polish process for a specific product and a specific metal layer. A method for developing and characterizing a polish process for polishing of an ILD layer 12 for a specific product is provided below.

Using single layer short-loop runs that generate a portion of the topography may give some insight into planarization behavior. These runs, however, are of very limited value for achieving development of a polish process for product wafers. Single layer short-loop runs lack the underlying topography and layout of underlying features that strongly effect both the end results and the metrology setup. Full structural runs with formation of complete underlying device layers are required for polish process development. Given the urgency of processing first silicon for a new product mask set, it is very rare that the polish module will be tested with a full-structure test lot in advance, such that all the topography from the start of the process flow exists on the wafers. (First silicon corresponds to the first time a product wafer is introduced into production.) With the method of the present invention, characterization and development of a polish process for a new layer can be performed on first silicon lots with the sacrifice of four wafers per layer. Typically, no more than four test wafers are required, each comprising a fully patterned layer(s) to be planarized. Additionally, the remaining wafers in the lot are non-destructively measured to complete the characterization.

Characterization of an ILD polish planarization requires metrology tools for oxide thickness and surface profile measurements, metal-sputtering processing capability, and a polisher. Oxide thickness over both metal and silicon substrate areas is measured with an oxide thickness measurement tool (Prometrix 650/750, Santa Clara, Calif.) possessing fine spot and pattern recognition capability. Surface profilometry is performed with a profilometer (Tencor P1/P2, Mountain View, Calif.).

A general overview of the characterization and development process is shown schematically in FIG. 4 and described below. The characterization and development process starts at block 54 of the flow chart in FIG. 4. At this stage, the surface of each product wafer to be used for polish process characterization comprises an unplanarized dielectric formed over a patterned interconnect. A single product wafer is chosen to be used as a first patterned test wafer. Using the oxide thickness measurement tool, the oxide thickness is measured over a patterned feature 24 such as a metal pad that serves as a measurement pad and also on an adjacent field area. The pattern feature 24 may also comprise an active pad comprising silicon on the base ILD layer 26 or a metal pad on other ILD layers 12, such as a second ILD layer or third ILD layer for a product with multiple layers of metal and ILD.

This first patterned test wafer is polished, as outlined in block 56, along with a first blank test wafer comprising the same type of oxide film at the surface. Both wafers are polished for a time long enough to remove an amount of oxide on the first blank test wafer equal to the height of the topographical step that will be planarized. This topographical step will usually be created by an underlying polycide step, for the case of a step at the surface of the base ILD layer 26. For the case of different metal layers within a product where each metal layer is isolated by a respective ILD, a topographical step may exist at the surface of the first ILD layer, second ILD layer, or third ILD layer, etc. This topographical step will usually be created by an underlying metal step at the surface of the first metal layer, the second metal layer, or third metal layer, respectively.

As outlined in blocks 58a–58c, the first patterned test wafer is re-measured after being polished to determine: (1) both the maximum amount of ILD removed from the field area in the die and the location within the die site of maximum ILD removal over the field areas (i.e., the location of maximum polish in the field areas), (2) the amount of ILD removed from a measurable topographic feature such as a measurement pad and from the field areas adjacent the measurement pad, and (3) the location and amount of TIR, across the die site. The ILD thickness is measured at the same location above a measurement pad and adjacent the measurement pad, both before and after polishing, to quantify the amount of ILD removed. The profilometer, aided by the oxide thickness measurement tool, is used to locate and measure the TIR across the die site. This information is used in the spreadsheet. Block 60 represents this step.

Usually, three blank test wafers and three removal targets for the blank test wafers are chosen to create a working range of polish amounts as indicated in block 62. The nominal removal target, $R_o$, is chosen to result in a calculated maximum step height for the worst case step in the ILD surface, which is shown in Table III, of approximately −1,500 Å. The low removal target $R_{min}$ should be about 20% to 25% less than $R_o$; the high removal target, $R_{max}$, should be 20% to 25% greater than $R_o$. Blocks 64a–64c represent these removal targets.

Next, as indicated in block 66, three additional product wafers to be used as patterned test wafers, as well as the three blank test wafers, are polished to achieve the three respective removal targets: $R_{min}$, $R_o$, and $R_{max}$. All the wafers are then cleaned. Again, oxide thickness and TIR are measured as described above, and the results are substituted into the statistically-based model. Block 68 represents these two steps. Three new spreadsheets are calculated.

The next several steps, indicated in blocks 70 and 72, are used to independently test the planarity of the surface. A thick titanium mirror is sputtered onto the polished ILD surface on the three patterned test wafers. Careful wholewafer, 1× magnification visual inspections of the wafers, accompanied by follow-up darkfield microscope inspections, are used to detect any residual local steps in the ILD surface that remain after polishing. Oftentimes these steps will appear on the patterned test wafer polished for removal target of $R_{min}$. This step in the characterization and development process is critical since it provides the only true gauge of the local planarity of the ILD surfaces.

The final step in this characterization and development process, is represented by blocks 74, 76a–76c, and 78. The measured data, i.e., the oxide thickness and TIR measured above, and the inspection data, with the aid of the spreadsheet and statistically-based model, are used to choose a optimum removal target for the final process.

The optimum removal target should be chosen by the following criteria:

(1) no local steps are visible in both patterned test wafers that were polished for lessor amounts than the removal target chosen; and (2) the maximum step height for the worst case step in the ILD surface calculated from the process model using the optimum removal target, is −1,500 Å or a larger negative number than −1,500 Å.

The chosen optimum removal target to serve as the blank wafer polish amount may be an interpolation between the three removal targets for the pattern test wafers. Once the blank wafer polish amount is fixed, the spreadsheet model may be used to determine the proper ILD deposition thickness that will result in the desired ILD thickness range. This sequence of steps which is outlined in the flow chart shown in FIG. 4, must be completed for each product.

For the generalized topographic structure shown in FIGS. 3a–3b, the same characterization and development process that is described above is employed. A detailed description of this characterization and development process specific to the generalized topographic structure is provided below.

One product wafer to be used as the first patterned test wafer is chosen for an initial polish characterization. Using the oxide thickness measurement tool in the pattern testing mode, the ILD thickness is measured. Measurements are obtained at location 38 over the metal pad which serves as a measurement pad, and on the adjacent field area where ILD layer #1 22 is lying over field oxide 34. These measurements are repeated for nine die sites across the wafer. For these measurements the oxide thickness measurement tool is operated at 5× magnification.

As described above, the first patterned test wafer and a first blank test wafer are polished for the time required to remove an amount of ILD from the first blank test wafer equal to the step height of the patterned metal structure 24 formed over the polysilicon structures 28. The amount polished is equal to the step height of the patterned feature that lie beneath the ILD layer 12. The amount polished is equal to the step height of a polysilicon structure 28 for the case of polishing the base ILD layer 26 or to the step height of metal layers for subsequent ILD layer polishes. The first patterned test wafer need only be dried after polishing using a spacer rinse drier (Semitool Inc., Kalispell, Mont.), a tool used to wet and dry the wafers using water while the wafers are constantly spinning.

The oxide thickness measurement tool is used in the manual testing mode for oxide on silicon, to find the location, within one die, where the ILD layer #1 22 formed over field oxide in the field areas is at a minimum thickness. This location in the field area is the location of maximum polish, or maximum removal, of ILD over field oxide. Within the same die, the location where ILD layer #1 22 formed over the field area is at a maximum thickness, is also found. This location is a measurable location of minimum polish of ILD over the field area. This location is typically near to the true location of minimum polish, or minimum removal, of ILD over field oxide, which may be in a dense array and not measurable by the oxide thickness measurement tool. The oxide thickness measurement tool is programmed in the "pattern testing/multiple site per die location mode" to obtain a measurement at each of the following locations: 1) the location of maximum polish of ILD layer #1 22 over field oxide 34 in the field area, 2) the location of minimum polish of ILD over field oxide in the field area, 3) the location of the metal pad that serves as measurement pad (location 38), and 4) the location on the ILD layer #1 over field oxide in the field area adjacent the measurement pad. These measurements are repeated for nine die sites across the wafer.

Using the profilometer, the highest point with respect to the substrate within the die site is located. Also, the deflection of the profilometer probe is measured between the highest point and location of minimum polish of ILD layer #1 22 over field oxide 34 in the field areas. To compute the TIR across the die site, the amount of deflection of the profilometer probe is added to the measured range of ILD thickness. The measured range of ILD thickness is the difference between ILD thickness at the location of minimum and maximum polish of ILD layer #1 22 over field oxide 34 in the field areas as determined by the oxide thickness measurement tool. The TIR is calculated for five die sites across the wafer. New values of minimum and maximum polish are obtained by the oxide thickness measurement tool for each of the five die sites across the wafer to calculate the TIR.

The data from the steps above, along with specification targets for the individual unit processes, are used to create a first spreadsheet for the first patterned test wafer. The values measured above are substituted into the first spreadsheet.

The blank test wafer polish amount for the first blank test wafer is entered as the nominal value of the specification target for 'Polish—Test Wafer', in cell C20 in Table I. The average values of ILD thickness determined by the oxide thickness measurement tool at the location of maximum polish of ILD layer #1 22 over field oxide 34 in the field area and at the location of the ILD layer #1 over field oxide in the field area adjacent the measurement pad, are entered as the nominal values for polish amount for 'ILD/fld ox (max removal)' and 'ILD/fld ox (adj meas pad)', cells C21 and C27 in the spreadsheet shown in Table I. The average value of TIR across the die as well as the variation in TIR for the five die sites across the wafer is entered as the nominal value of the specification target and <3σ> process envelope for 'Polish-TIR', cells C19 and D19 in the spreadsheet shown in Table I.

Metal step height specification targets are entered as nominal value and percent variation for 'Metal Step Height-Nominal', cells C11 and B11 in Table I. The sum of the specifications targets, twice the PETEOS deposition specification and the spin-on-glass specification, is entered as nominal value for the 'Spacer PETEOS Deposition', cell C14. The specification target for spacer etchback is entered as the nominal value for the 'RIE Spacer Etchback', cell C15. The specification targets, thrice the PETEOS deposition specification and twice the oxide wet etch specification, are entered as the nominal value for 'ILD PETEOS Deposition' and 'Oxide Wet Etch', cells C16 and C17, respectively.

The spreadsheet will yield values of ILD thickness and post-polish step height for the six topographical structures at the six structurally-different sites. In Table III, the value of the maximum step height expected for the worst case structure, i.e., the maximum step height for the worst case step in the ILD surface, cell I26 in the spreadsheet, must be checked since empirical evidence suggests that this value should be a larger negative number than −1,500 Å.

Next, three product wafers are chosen to be used as patterned test wafers. A range of removal targets for three blank test wafers and for processing the three patterned test wafers are selected. The procedure for selecting the range of removal targets includes creating three new spreadsheets by modifying the first spreadsheet. In each of the three spreadsheets, the blank test wafer polish amount, cell C20, is adjusted. The goal is to select a nominal removal target, $R_0$, such that the value of the maximum step height expected for the worst case structure, in cell I26 of the spreadsheet shown in Table III, is −1,500 Å or a larger negative number than −1,500 Å. A low removal target, $R_{min}$, is selected such that $R_{min}=0.8R_0$ and a high removal target, $R_{max}$, is selected such that $R_{max}=1.2R_0$. The three removal targets, $R_{min}$, $R_0$, and $R_{max}$, are used as the blank test wafer polish amount for the three blank test wafers, respectively. Accordingly the values for the these three removal targets are enter into cell C20 of the three spreadsheets.

Estimated values of the maximum amount of ILD removed from the field area and the amount of ILD removed from the field area adjacent the measurement pad for each of the different blank wafer targets $R_{min}$, $R_0$, and $R_{max}$, must be chosen. The difference in these estimated values for each of the different blank wafer targets must remain constant. This constant difference must be the same as the difference as calculated in the first spreadsheet.

The estimated values of the maximum amount of ILD removed from the field area for each of the different blank wafer targets is entered in cell C21 of the three spreadsheets. The estimated values of amount of ILD removed from the field area adjacent the measurement pad for each of the different blank wafer targets is entered in cell C27 of the three spreadsheets.

The oxide thickness measurement tool is used to take pre-polish measurements on the three patterned test wafers at the four locations programmed previously using the first patterned test wafer as a guide for defining the four locations. Pre-polish measurements on additional product wafers may also be made.

Next, the three patterned test wafers and associated blank test wafers are polished for the new removal targets: $R_{min}$, $R_0$, and $R_{max}$. The three patterned test wafers are cleaned. The oxide thickness measurement tool is used to measure the ILD thicknesses at the four locations programmed previously. The profilometer is used to measure the TIR as described above. These measured values for maximum amount of ILD removed from the field area, amount of ILD removed from the field area adjacent the measurement pad, TIR, and TIR variation, for each of the three patterned test wafers are entered into the three respective spreadsheets. These measured values are entered into cells C19, D19, C21, and C27 in the three spreadsheets. Also, the amount of oxide removed form the blank test wafers is measured for each blank test wafer. The measured values of the blank test wafer polish amounts inserted in cell C20 of the three spreadsheets.

Titanium sputter-deposition is employed to form a 1,000 Å Ti film on the three polished pattern test wafers producing a mirror on the surface of the ILD of each wafer. The wafers are carefully inspected visually to detect any residual local steps present in the oxide surface after polishing. Tilting the wafers to reflect room light from the surface at different angles aids in detecting any residual local steps. Any areas where steps are suspected are checked by inspection using a darkfield microscope. Oftentimes some surface nonplanarity will appear on the $R_{min}$ polished wafer. The wafers, if any, which show local nonplanarity on the surface are determined.

The optimum removal target is chosen to process the remaining wafers in the lot. The choice is based on information gathered from the oxide thickness and profilometry measurements as well as from the visual inspections made on the three patterned test wafers. The optimum removal target will roughly correlate to the interconnect or underlayer step height to be planarized. The optimum removal target is determined using the following procedure:

Any removal target that results in observed local nonplanarity of the surface after inspection is eliminated.

Removal targets in the range where no local steps are visible in the polished patterned wafers are considered. The range of removal targets that lie between the two least polished patterned test wafers on which no steps are observed, are excluded from consideration.

The three updated spreadsheets for the three patterned test wafers are examined. The value of the maximum step height for the worst case step in the ILD surface, cell I26 in Table III, is checked. This value should be a larger negative number than $-1500$ Å for the removal target to be acceptable; and From the allowed range of removal targets that can be considered based on visual observation of the surface planarity, the removal target that results in a computed value for the maximum step height for the worst case step in the ILD surface, cell I26 in Table III, of $-1,500$ Å is chosen. The removal target selected may be one of the three removal targets previously tested, such as $R_0$ or $R_{max}$, or the removal target may be an interpolation re-computed by the spreadsheet.

The remaining wafers in the lot are polished using the optimum removal target chosen above. Initial oxide thickness data is collected before polishing on at least six product wafers. These six product wafers are spaced throughout the product cassette which include two blank test wafers in the first and last slot to capture within-run statistics. The lot is cleaned after polishing.

The ILD thicknesses and TIR are measured, as described above. The TIR determined from polishing of the underlying layers is used when called for in the spreadsheet. For example, while polishing the second ILD layer, the third ILD layer, the fourth layer, etc., the TIR for the previous ILD layer 12 is also taken into account in the spreadsheet. The run average values are determined, including TIR variation. These averaged values for TIR, TIR variation, maximum amount of ILD removed from the field area and amount of ILD removed from the field area adjacent the measurement pad for each of the three patterned test wafers are entered into the spreadsheet. The amount of oxide removed form the blank test wafers is measured for each blank test wafer. The measured values of the blank test wafer polish amounts inserted in cell C20 of the spreadsheet. Visual inspection of the at least one of the product wafers is performed to identify any local steps on the ILD surface.

The updated spreadsheet is examined to verify that the maximum step height for the worst case step in the ILD surface, cell I26 in Table III, is $-1,500$ Å or is a larger negative number than $-1,500$ Å. The value of ILD deposition, cell C16 in Table I, is adjusted so that the minimum ILD thickness, cell K32 in Table I, achieves the design rule value required for the specific product.

The new ILD deposition, minimum ILD thickness, maximum ILD thickness, blank test wafer polish amount, TIR and TIR variation should ensure improved planarity.

For good accuracy needed to set process specifications, it is best to monitor a sufficient number of lots (e.g. five to ten lots), all identically processed, to acquire a large statistical database to use in the statistically-based model. For instance, ILD thickness data and profilometry data can be collected on two wafers from each lot to determine values for TIR, TIR variation, blank test wafer polish amount, maximum amount of ILD removed from the field area and amount of ILD removed from the field area adjacent the measurement pad. The values of these parameters from all the runs monitored is averaged and a new spreadsheet that represents the total process envelope for the full product polish process is calculated.

The process development methodology described above is extendible with respect to minimum interconnect feature size. This polish process development methodology can also be applied to products requiring multiple planarizations for multiple levels of interconnects.

This methodology can be successfully applied to technologies (1) ranging in feature size from 0.7 μm to 0.35 μm or smaller, (2) having from four to five or more conductor levels and (3) requiring from two to four or more ILD polish planarizations.

INDUSTRIAL APPLICABILITY

The method for characterizing and developing a polishing process of the invention is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced to remove materials other than oxide from the surface of a semiconductor wafer. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for characterizing polishing of semiconductor product wafers comprising a film coating having a film coating thickness deposited over patterned features on an underlayer, said polishing being used to remove steps in said film coating caused by said patterned features, said semiconductor product wafers comprising a plurality of identical die sites across said semiconductor product wafer, said method comprising:

(a) polishing a first patterned test wafer selected from said semiconductor product wafers for a time long enough to remove an amount of film coating equal to the step height of said patterned features;

(b) determining four locations within a single die on said first patterned test wafer corresponding to (i) a location at or near the location of maximum removal of said film coating, (ii) a location at or near the location of minimum removal of said film coating, (iii) a first position over a measurable topographic feature and (iv) a second position adjacent said first position in a region not over said patterned features;

(c) measuring said film coating thickness at said four locations on said first patterned test wafer;

(d) determining the highest point on said film coating within said single die;

(e) measuring the difference between said film coating thickness at said highest point and said location at or near said location of minimum removal;

(f) adding said difference in said film coating thickness between said highest point and said location at or near said location of minimum removal to the difference between said film coating thickness at said location at or near said location of minimum removal and said location at or near said location of maximum removal to calculate a total indicated range;

(g) determining the total indicated range variation;

(h) calculating the maximum step height for a worst case step in said film coating;

(i) selecting at least one additional patterned test wafer from said semiconductor product wafers;

(j) selecting a removal target for each of said additional patterned test wafers such that said maximum step height for said worst case step in said film coating is maintained below a designated step height;

(k) measuring said film coating thickness of each of said additional patterned test wafers at said four locations;

(l) polishing each of said additional patterned test wafers for a time long enough to remove an amount of film coating equal to each of said removal targets;

(m) measuring said film coating thickness at said four locations on each of said additional patterned test wafers;

(n) determining said total indicated range and said total indicated range variation for each of said additional patterned test wafers;

(o) visually inspecting each of said additional patterned test wafers for steps in said film coating; and (p) choosing an optimum removal target for processing said semiconductor product wafers.

2. The method of claim 1 wherein said polishing is accomplished using chemical mechanical polishing.

3. The method of claim 1 wherein said film coating comprises an interlayer dielectric layer.

4. The method of claim 1 wherein said patterned features comprise patterned features selected from the group consisting of patterned metal structures, patterned oxide, patterned single crystal silicon, patterned nitride, polysilicon structures, measurement pads, dense patterned metal lines over dense polysilicon structures, patterned metal lines over source/drain regions, and active pads comprising silicon.

5. The method of claim 1 wherein said measurable topographic features comprise measurable topographic features selected from the group consisting of measurement pads, metal pads and active pads comprising silicon.

6. The method of claim 1 wherein said film coating thickness is measured at said first position over said measurable topographic feature and at said second position adjacent said first position in a region not over said patterned features before polishing said first patterned test wafer.

7. The method of claim 1 wherein said time for polishing is determined by providing blank test wafers for polishing, each blank test wafer comprising an identical film coating formed on a blank semiconductor substrate, and by polishing said blank test wafers for a time long enough to remove an amount of film coating equal to said step height of said patterned features, said identical film coating identical in composition and thickness to said film coating formed on said semiconductor product wafers.

8. The method of claim 1 wherein a profilometer is used in determining said highest point on said film coating and to measure the difference between said film coating thickness at said highest point and said location at or near said location of minimum removal.

9. The method of claim 1 wherein an average total indicated range and said total indicated range variation are calculated by determining said total indicated range within at least one other die site, said average total indicated range being used as said total indicated range in calculating said worst case step in said film coating.

10. The method of claim 1 wherein three additional patterned test wafers and three removal targets are chosen, said three removal targets corresponding to a nominal removal target, $R_0$, chosen such that said maximum step height expected for said worst case step is smaller than said designated step height, and said other two removal targets, $R_{min}$ and $R_{max}$, corresponding to 1.2 $R_0$ and 0.8 $R_0$ respectively.

11. The method of claim 1 wherein a metal film is deposited on each of said additional patterned test wafers prior to visually inspecting each of said additional patterned test wafers to form a mirror on said film coating.

12. The method of claim 1 wherein a procedure is used for selecting an optimum removal target for polishing said semiconductor product wafers comprising:

(a) eliminating any removal targets that result in observed local nonplanarity in said patterned test wafers;

(b) calculating said maximum step height for said worst case step in said film coating for each of said patterned test wafers; and (c) accepting only removal targets which produce a value of said maximum step height for said worst case step which is smaller than a designated standard.

13. The method of claim 12 wherein said designated step height for said maximum step height for said worst case step is −1500 Å or a larger negative number than −1,500 Å.

14. The method of claim 12 wherein said optimum removal target is an interpolation between said removal targets for at least two of said additional patterned test wafers.

15. The method of claim 1 wherein an appropiate amount of film coating to be deposited on said patterned features of said semiconductor product wafers is calculated such that the minimum thickness of said film coating after polishing is not below a design rule value for said minimum thickness for said semiconductor product wafers.

16. The method of claim 1 wherein a spreadsheet based on a statistically-based model of said polish process is used in calculating said maximum step height for said worst case step in said film coating.

17. The method of claim 16 wherein (i) a removal target, (ii) said total indicated range, (iii) said total indicated range variation, (iv) said film coating thickness at said location at or near said location of maximum removal, and (v) said film thickness at said second position in said region not over said patterned features are entered into said spreadsheet.

18. The method of claim 16 wherein specification targets and semiconductor process control limits for each process step comprised in said polishing process are entered into said spreadsheet.

19. The method of claim 12 wherein at least one of said semiconductor product wafers is chosen as a patterned test wafer to be used to collect data and to verify that said maximum step height for said worst case step is smaller than said designated step height by a procedure comprising:
  (a) measuring said film coating thickness of each of said patterned test wafers at said four locations;
  (c) polishing said patterned test wafers for a time long enough to remove an amount of film coating on a blank test wafer comprising an identical film coating on a blank substrate, equal to said optimum removal target, said identical film coating identical in composition and thickness to said film coating on said semiconductor product wafers;
  (d) measuring said film coating thickness at said four locations on each of said patterned test wafers;
  (e) determining said total indicated range and said total indicated range variation for each of said patterned test wafers;
  (f) inspecting each of said patterned test wafers for steps on said film coating;
  (h) calculating said maximum step height at said worst case step; and
  (i) calculating an appropriate amount of film coating to be deposited such that said minimum thickness of said film coating after polishing is not below a design rule value for said minimum thickness for said semiconductor product wafer.

20. The method of claim 1 wherein a spreadsheet based on a statistically-based model of said polish process is used in calculating said maximum step height for said worst case step, and wherein at least one of said semiconductor product wafers in at least one additional lot of said semiconductor product wafers is chosen to be a patterned test wafer for collecting data and to refine said statistically-based model by a procedure comprising:
  (a) polishing said additional lot which includes each of said patterned test wafers long enough to remove an amount of film coating on a blank test wafer that is equal to said optimum removal target determined from a previous lot, said blank test wafer comprising an identical film coating on a blank substrate, said identical film coating identical in composition and thickness to said film coating on said semiconductor product wafers;
  (b) measuring said film coating thickness at said four locations within a plurality of die sites on each of said patterned test wafers;
  (c) determining said total indicated range and said total indicated range variation for each of said patterned test wafers; and
  (d) calculating average values (i) of said film coating thickness measured at said location at or near said location of maximum removal, (ii) of said film coating thickness measured at said second position in said region not over said patterned features, (iii) of said total indicated range, and (iv) of said total indicated range variation for said additional lot, said average values to be used to create a new spreadsheet.

21. A method for characterizing and developing a polish process for polishing a lot of semiconductor product wafers comprising an interlayer dielectric layer having an interlayer dielectric thickness deposited over patterned features and field oxide in field areas between said patterned features, said polishing being used to remove steps in said interlayer dielectric layer, said steps caused by said patterned features, steps in an underlayer or different structures all which lie beneath said interlayer dielectric layer, said semiconductor product wafers comprising a plurality of identical die sites across said semiconductor product wafer, said method comprising:
  (a) choosing a first patterned test wafer from said lot of semiconductor product wafers;
  (b) measuring said interlayer dielectric thickness at a first position over a measurable topographic feature and at a second position in a field area adjacent said position;
  (c) providing a plurality of blank test wafers each comprising an interlayer dielectric formed on a blank semiconductor substrate comprising the same composition, and thickness as said interlayer dielectric layer formed on said semiconductor product wafers;
  (d) polishing said first patterned test wafer and a first blank test wafer selected from said plurality of blank test wafers to remove an amount of interlayer dielectric equal to the height of said patterned features;
  (e) determining four locations within a single die on said first patterned test wafer corresponding to (i) the location of maximum removal of said interlayer dielectric layer over said field areas, (ii) the location of minimum removal of said interlayer dielectric layer over said field areas, (iii) said first position over said measurable topographic features and (iv) said second position in said field area adjacent said first position;
  (f) measuring said interlayer dielectric thickness of said first patterned test wafer at said four locations;
  (g) determining the highest point on said interlayer dielectric layer within said single die;
  (h) measuring the difference between said interlayer dielectric thickness at said highest point and said location of minimum removal;
  (i) adding said difference in said interlayer dielectric thickness between said highest point and said location of minimum removal to the difference between the interlayer dielectric thickness at said location of minimum removal and said location of maximum removal to calculate a total indicated range;
  (j) determining said highest point on said interlayer dielectric layer within at least one other die site and repeating steps (h) and (i) to calculate an average total indicated range and a total indicated range variation;

(k) calculating the maximum step height for a worst case step in said interlayer dielectric layer;

(l) choosing at least one additional patterned test wafer from said lot of product wafers and at least one additional blank test wafer from said plurality of blank test wafers;

(m) selecting a removal target for each of said additional patterned test wafers and each of said additional blank test wafers such that the maximum step height for a worst case step in said interlayer dielectric layer is maintained below a designated step height;

(n) measuring said interlayer dielectric thickness of each of said additional patterned test wafer at said four locations;

(o) polishing each of said additional patterned test wafers and each of said additional blank test wafers to remove an amount of interlayer dielectric equal to each of said removal targets;

(p) re-measuring said interlayer dielectric thickness at said four locations on each of said additional patterned test wafers;

(q) determining said average total indicated range and said total indicated range variation for each of said additional patterned test wafers by repeating steps (g), (h) and (i);

(r) inspecting each of said additional patterned test wafers for steps on said interlayer dielectric layer; and (s) choosing an optimum removal target for processing said semiconductor product wafers remaining in said lot based on said interlayer dielectric thickness measured at said four locations, said average total indicated range and said total indicated range variation for said additional patterned test wafers, and information obtained from inspecting each of said additional patterned test wafers.

22. The method of claim 24 wherein said measurable topographic features comprise measurable topographic features selected from the group consisting of measurement pads, metal pads and active pads, comprising silicon.

23. The method of claim 21 wherein said patterned features comprise patterned features selected from the group consisting of patterned metal structures, patterned single crystal silicon, polysilicon structures, measurement pads, dense patterned metal lines over dense polysilicon structures, patterned metal lines over source/drain regions, and active pads comprising silicon.

24. The method of claim 21 wherein said patterned features comprise patterned metal structures, a portion of said patterned metal structures being formed over polysilicon structures, and said maximum step height for said worst case step is defined in a spreadsheet based on a statistically-based model as the sum of said average total indicated range, said interlayer dielectric thickness at said location of maximum removal of said interlayer dielectric layer over said field areas, the thickness of said field oxide, the square of the semiconductor process control limits from metal step height specifications, the square of the semiconductor process control limits from oxide wet etch specifications, the square of the semiconductor process control limits from polishing specifications, the square of said total indicated range variation, the square of the variation in the step height of said polysilicon structures, and the square of the step height of said field oxide.

* * * * *